(12) United States Patent
Cross

(10) Patent No.: US 6,995,693 B1
(45) Date of Patent: Feb. 7, 2006

(54) METHOD AND APPARATUS FOR MULTIPLE INPUT DIVERSITY DECODING

(75) Inventor: Ray Lynn Cross, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 10/728,076

(22) Filed: Dec. 4, 2003

(51) Int. Cl.
  *H03M 7/34* (2006.01)
  *H03M 7/38* (2006.01)
  *H03M 13/03* (2006.01)

(52) U.S. Cl. .................................... 341/51; 714/792
(58) Field of Classification Search ................. 341/50, 341/51; 370/204, 209; 375/148, 341; 714/758, 714/774, 780, 788, 792, 797; 455/101
See application file for complete search history.

(56) References Cited

U.S. PATENT DOCUMENTS

| 4,001,692 | A | * | 1/1977 | Fenwick et al. ............. 714/797 |
| 5,406,570 | A | * | 4/1995 | Berrou et al. ............... 714/792 |
| 5,446,747 | A | * | 8/1995 | Berrou ....................... 714/788 |
| 5,623,485 | A | * | 4/1997 | Bi .............................. 370/209 |
| 6,233,709 | B1 | * | 5/2001 | Zhang et al. ............... 714/774 |
| 6,271,772 | B1 | * | 8/2001 | Luschi et al. ................. 341/51 |
| 6,317,411 | B1 | * | 11/2001 | Whinnett et al. ........... 370/204 |
| 6,353,911 | B1 | * | 3/2002 | Brink ......................... 714/780 |
| 6,594,473 | B1 | * | 7/2003 | Dabak et al. ............... 455/101 |
| 6,615,385 | B1 | * | 9/2003 | Kim et al. .................. 714/758 |
| 6,754,253 | B2 | * | 6/2004 | Guey ......................... 375/148 |
| 6,876,709 | B1 | * | 4/2005 | Kim et al. .................. 375/341 |

* cited by examiner

*Primary Examiner*—Patrick Wamsley
(74) *Attorney, Agent, or Firm*—Nathan O. Jensen; Kyle Eppele

(57) ABSTRACT

Several embodiments of a multiple input diversity decoding apparatus and method are disclosed. In one embodiment, two or more diversity decoders work together to iteratively decode information. Each diversity decoder can include two or more partial decoders. In another embodiment, a plurality of partial decoders work together to iteratively decode information received in a diversity application.

14 Claims, 5 Drawing Sheets

METHOD AND APPARATUS FOR MULTIPLE INPUT DIVERSITY DECODING

GOVERNMENT LICENSE RIGHTS

The U.S. Government has a paid-up license in this invention and the right in limited circumstances to require the patent owner to license others on reasonable terms as provided for by the terms of contract number F33615-01-C-1856 awarded by the DARPA-TTNT program.

FIELD OF THE INVENTION

The present invention generally relates to an apparatus and method for performing diversity decoding on multiple received inputs, and more particularly relates to a method and apparatus combining the diversity determination and the decoding process, and even more particularly relates to iterative decoding in a diversity application of codes such as low density parity check codes, "turbo" codes or other codes having a structure permitting the decoding of multiple received inputs.

BACKGROUND OF THE INVENTION

Diversity reception schemes, wherein a transmitted signal is essentially simultaneously received on two or more antennas of a receiver system, are known. An advantage of a diversity system is that, as a result of a multitude of factors, one of the antennas may provide the receiving system with a signal superior to the signals received at the other antennas of the system. For example, the signals received on each antenna may be received with different amounts of disturbances (such as noise, distortion, multi-path interference, jamming, etc.).

When a transmitted signal is received on multiple antennas, it is possible in decoding to exploit the differences in the signals received by those antennas. In prior systems, the signals received by the multiple antennas are analyzed, determinations are made, and a single signal is output to a digital decoder as a single stream of soft decisions. The diversity determination component may simply select one of the multiple received signals to output to the decoder or it may combine the multiple signals in some way to create the output signal.

Typical diversity combining schemes, however, only process the received signal on a symbol-by-symbol basis. Since only a single stream of information is output to the decoder, much of the received data and associated coding received via the multiple inputs is not passed to the decoder and therefore cannot be used to help decode the received signal. As a result, such systems do not exploit the redundancies that occur within the error correction and detection coding that may be transmitted with the received data.

In addition, error correction coding schemes have been developed to increase the reliability and efficiency of radio frequency communications. For example, a class of codes known by many as low density parity check codes has been developed for this purpose. Codes popularly known as Turbo Codes provide a specific example of such a coding scheme. Such codes can be decoded at the receive end by a process known as iterative decoding. U.S. Pat. No. 5,406,570, issued Apr. 11, 1995, and U.S. Pat. No. 5,446,747, issued Aug. 29, 1995, provide examples and descriptions of prior encode and decode systems using error protection coding and iterative decoding.

Presently, there exists a need for a multiple input diversity decoding system that can exploit, rather than discard, the redundancies in received low density parity check source coding. Further needed is a multiple input diversity decoding system that is practical for use with a wide variety of communication systems and coding schemes. In addition, a multiple input diversity decoding system that can be used with various types of input signals, wired and wireless, radio frequency and non-radio frequency, is needed.

SUMMARY OF THE INVENTION

It is an object of the present invention to provide a multiple input diversity decoding system.

It is a feature of the present invention to utilize the coding redundancies received via the multiple inputs to enhance the decoding process.

It is an advantage of the present invention to bring about an increase in coding gain and thereby increase system performance and efficiency.

The present invention is an apparatus and method for a multiple input diversity decoding system. For example, the invention can facilitate an increase in performance by taking greater advantage of the redundancies received via the multiple inputs. If multiple copies of an input signal are received by a diversity decoding system, a sharing of the soft decoding information gleaned from the multiple inputs, and the iterative processing thereof, can result in an increase in coding gain.

By way of further example, the present invention eliminates the separate diversity determination procedure that was performed in prior systems before proceeding to digitally decode the information. Additionally, it can be said that the present invention is carried out in a "waste-less" manner in the sense that received coding redundancies are exploited, rather than discarded, in order to enhance the decoding process.

BRIEF DESCRIPTION OF THE DRAWINGS

The invention may be more fully understood by reading the following description of the invention, in conjunction with the appended drawings, wherein.

DETAILED DESCRIPTION

Figure 1:
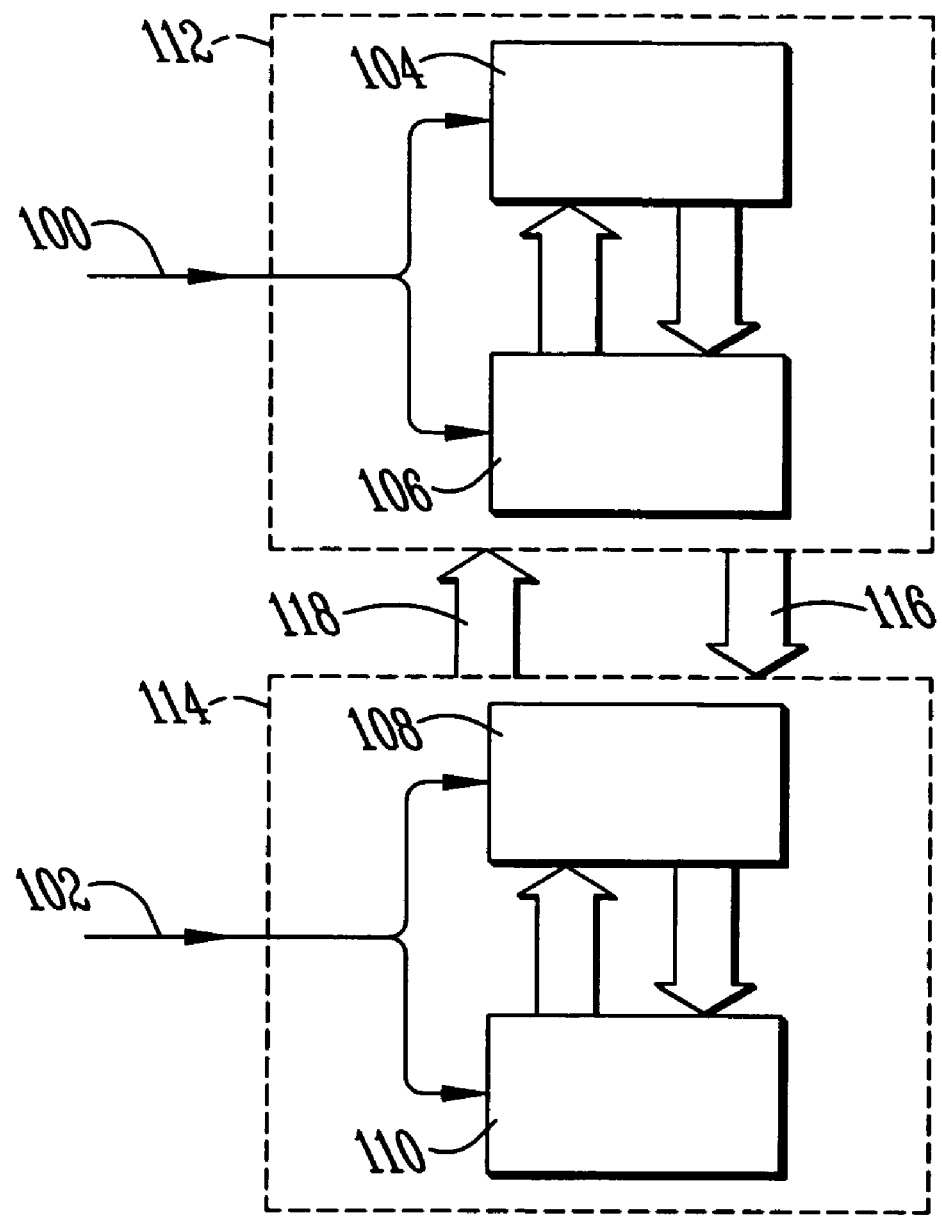
FIG. 1 depicts an embodiment of a multiple input diversity decoding apparatus including two inputs and four partial decoders, the partial decoders being grouped into two subsets.

FIG. 1 depicts an embodiment of the present invention including two inputs 100, 102 and four partial decoders 104, 106, 108, 110. As will be appreciated from the following descriptions, this embodiment can be scaled and modified to meet various design needs. The two inputs 100, 102 represent the reception of two instances of the same information (for example a single symbol or stream of symbols) received essentially concurrently. Such a communication method is typically referred to as a diversity communication scheme. In a diversity application, multiple copies of an information set are sent to attempt to overcome distortions and interferences that can degrade a signal during transmission. Although FIG. 1 depicts two inputs 100, 102, other embodiments of FIG. 1 can include three, four or more inputs.

The two inputs 100, 102 can each receive their signal from a coupled antenna and radio frequency receiver (not shown). The present invention, however, is not limited to radio frequency communication systems. The inputs of this or any of the other embodiments can be received via other communication media. For example, the present inventions can be receive input via other wireless methods such as infrared, IRDA, other wireless optical communication methods, optic fiber, or even wired communication systems or networks.

One of the inputs 100 is provided to a subset 112 of the partial decoders. Subsets of partial decoders work together to iteratively decode information received from an input. In the embodiment of FIG. 1, the upper input line 100 is fed to two of the partial decoders 104, 106 and the lower input line 102 is fed to two different partial decoders 108, 110. If desired, however, each of the subsets 112, 114 can include more than two partial decoders. For example, each subset 112, 114 can contain three, four, five, six or more decoders. Increasing the number of partial decoders can enhance the decoding capability of the system and thereby increase the reliability of the communications. Further, if desired, each subset can contain a different number of partial decoders. For example, one subset can contain two partial decoders and the other subset can contain more than two decoders. A subset of partial decoders will also be referred to as a diversity decoder.

The partial decoders of a subset work together to iteratively decode the inputted information. In FIG. 1, two partial decoders 104, 106 iteratively decode information received on one input 100 while the other two partial decoders 108, 110 iteratively decode information received via the other input 102. Decode modules similar to those described in the U.S. Patents cited above in the Background section, for example, can be used for the partial decoders described in the various embodiments presented throughout this specification. The specification and drawings of U.S. Pat. No. 5,406,570, issued Apr. 11, 1995, and U.S. Pat. No. 5,446,747, issued Aug. 29, 1995, are hereby each incorporated herein in their entirety by this reference.

At various points, a subset 112 of partial decoders 104, 106 that is iteratively decoding one of the signals 100 can send 116 its determination to the other subset 114 of partial decoders 108, 110. For example, the subsets 112, 114 of partial decoders could share 116, 118 their determinations after each iteration. In other implementations, the subsets 112, 114 of partial decoders share their determinations after every second, or after every third or more iterations.

The partial decoders 104, 106,108, 110 can keep iterating and decoding in such a fashion until it is determined that their determinations are in sufficient agreement as to the identity of the communicated source information segment. In addition, a limit can be set on the number of iterations to perform. If the subsets 112, 114 of partial decoders are not in sufficient agreement after the performance of a certain number of iterations, the determination of the identity of the source information segment at the point the iteration limit is reached can be output from the multiple input diversity decoding system as the result of the decode process.

Further, the determinations arrived at by one subset 112 of partial decoders can be taken into account by the other subset 114 as it performs its iterations. For example, the determinations made by each of the subsets can be averaged together periodically. The averaged determination can then also be taken into account by the partial decoders during the next iteration. The averaging can be performed after each iteration or after each second, third, or fourth, etc. iteration as desired.

Figure 2:
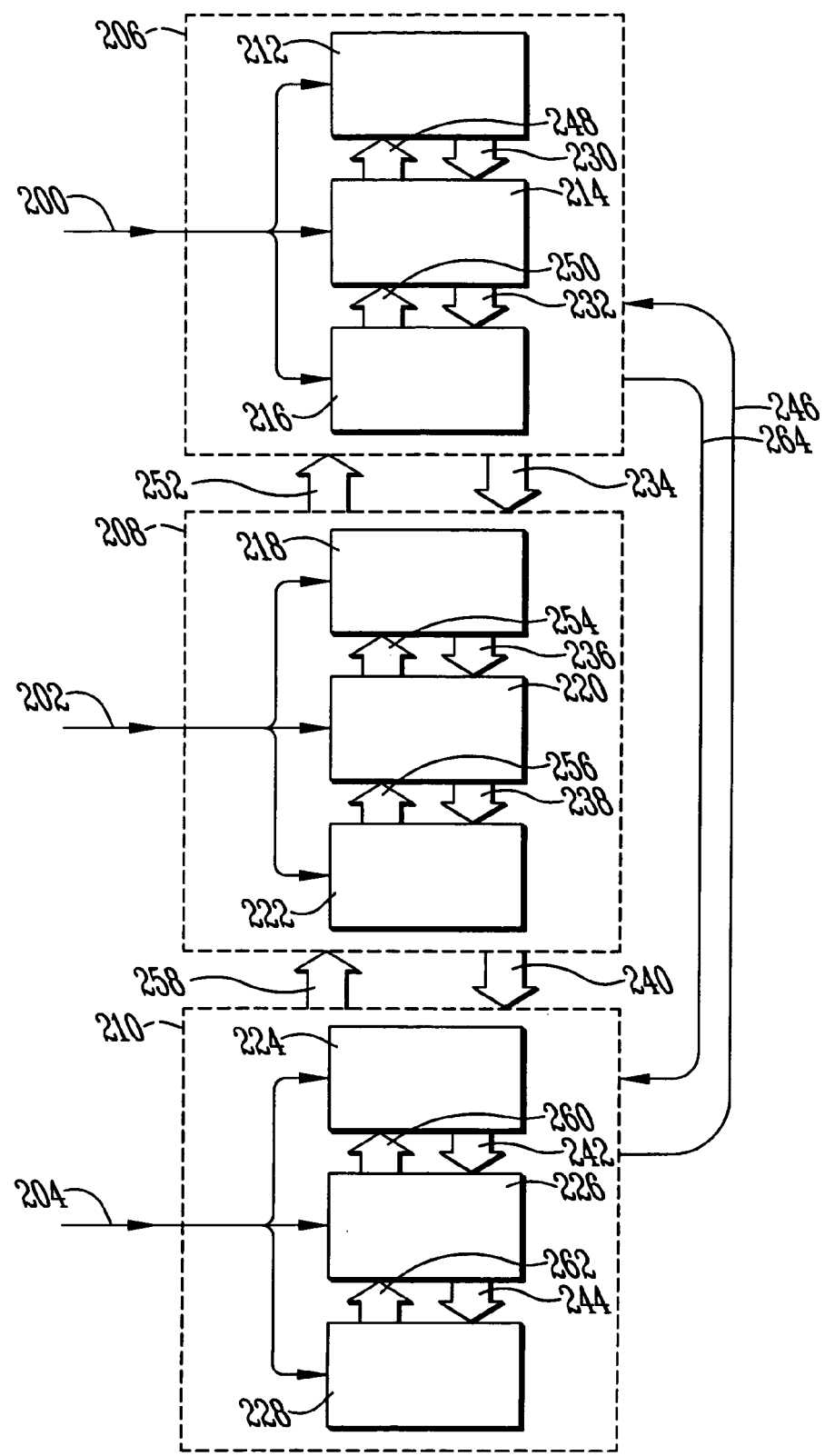
FIG. 2 depicts an embodiment of a multiple input diversity decoding apparatus including three inputs and nine partial decoders, the partial decoders being grouped into three subsets.

FIG. 2 depicts another embodiment of the system described in relation to FIG. 1. FIG. 2 includes three input lines 200, 202, 204 and three subsets 206, 208, 210 of partial decoders 212, 214, 216, 218, 220, 222, 224, 226, 228. As noted above, differing numbers of inputs, subsets and partial decoders can alternatively be implemented. Further, it is not required that the number of inputs in a system match the number of partial decoders in each subset. For example, a three input system having two partial decoders per subset is also within the scope of the invention. Likewise, other three input systems can have four or more partial decoders per subset.

Whenever, as in FIG. 2 for example, a system includes more than two subsets or more than two partial decoders per subset, it is not necessary to have two-way communication between each partial decoder or between each subset of partial decoders. In the context of FIG. 2, for example, communication links 230, 232, 234, 236, 238, 240, 242, 244 and 246 can be included or excluded as desired. When those links (230–246) are not included, communication (248–264) flows in just one direction and passes through every partial decoder.

Figure 3:
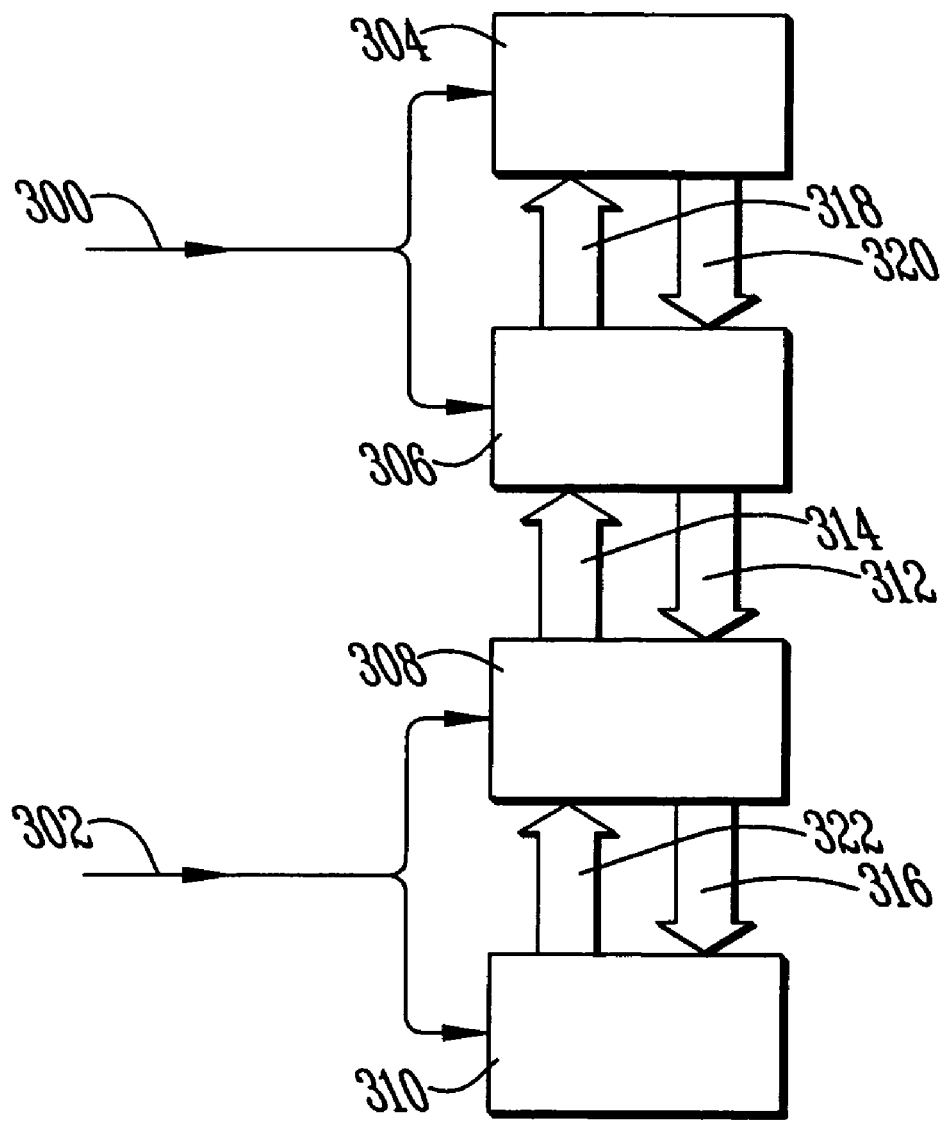
FIG. 3 depicts an embodiment of a multiple input diversity decoding apparatus including two inputs and four partial decoders, the partial decoders not being grouped into subsets.

FIG. 3 depicts another embodiment of a multiple input diversity decoding system. In contrast to the embodiments described in relation to FIGS. 1 and 2, the embodiment of FIG. 3 does not group partial decoders into subsets. Rather, in FIG. 3, the partial decoders communicate directly with each other to iteratively decode the inputted information.

The embodiment of FIG. 3 depicts a system having two inputs 300, 302 and four partial decoders 304, 306, 308, 310. One input 300 is fed to two of the partial decoders 304, 306 and the other input 302 is fed to the other two partial decoders 308, 310. Not only do the partial decoders work in pairs (304, 306 and 308, 310) to decode information provided by their respective inputs 300, 302, but two of the partial decoders 306, 308 also communicate 312, 314 determinations regarding their respective input 300, 302 to a partial decoder 308, 306 that is coupled directly to the other input 302, 300. For example, a partial decoder 306 coupled directly with one input 300 communicates 312 a determination based on information received via its input 300 to a partial decoder 308 that is coupled to the other input 302. Similarly, the partial decoder 308 coupled directly with input 302 communicates 314 a determination based on information received via that input 302 to a partial decoder 306 that is coupled to the other input 300.

In turn, at the next iteration the next determination (which includes information based on a determination estimating input 300) is passed 316 to partial decoder 310. Similarly, a concurrent determination (which includes information based on a determination estimating input 302) is passed 318 to partial decoder 304. The iterations proceed until the determinations made by the partial decoders are sufficiently in agreement. If desired, a limit can be placed on the number of iterations that will be performed.

Figure 4:
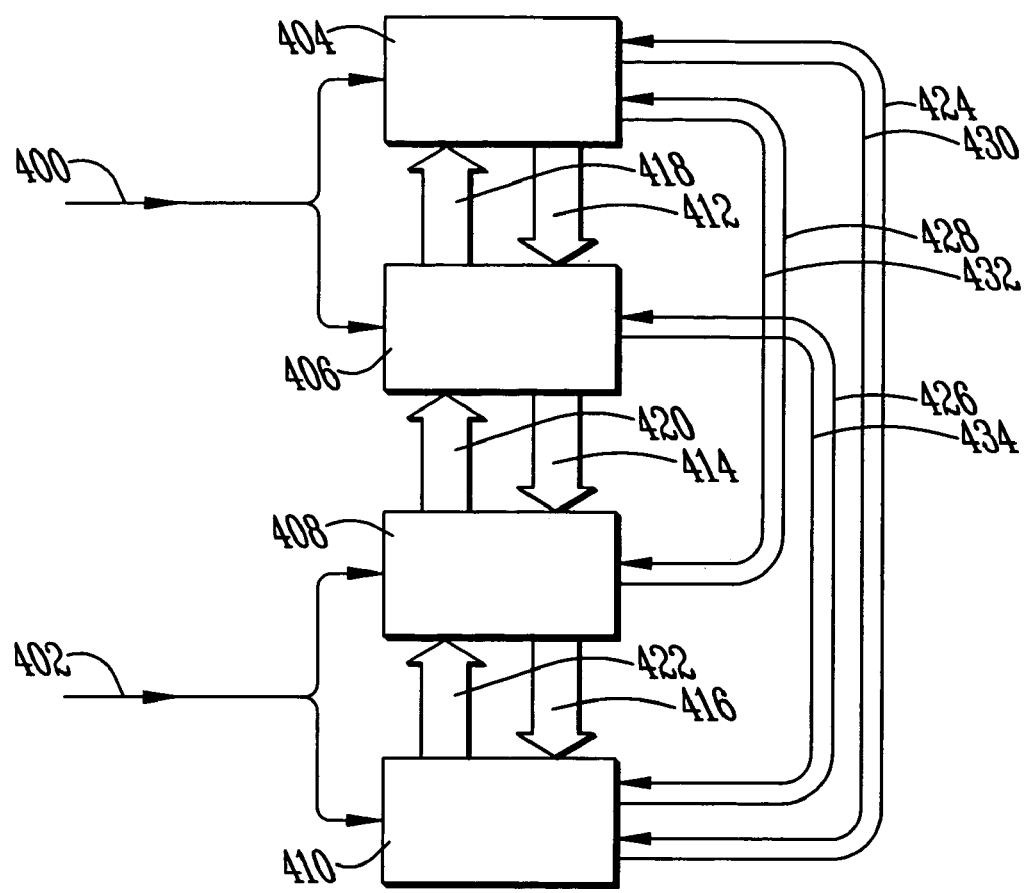
FIG. 4 depicts an embodiment of a multiple input diversity decoding apparatus similar to that of FIG. 3, but having different connectivity between the partial decoders.

FIG. 4 depicts an embodiment of a multiple input diversity decoder that is similar in several respects to the embodiment of FIG. 3. Two inputs 400, 402 are provided to four partial decoders 404, 406, 408, 410 in the same manner as is depicted in FIG. 3. The embodiment of FIG. 4, however, includes even greater connectivity between partial decoders.

The partial decoders 404, 406, 408, 410 are fully interconnected. The partial decoders communicate 412, 414, 416, 418, 420, 422 determinations in the manner described in relation to FIG. 3. In addition, however, three communication links 424, 426, 428, 430, 432, 434 not present in the FIG. 3 embodiment are included in FIG. 4. Thus, in this embodiment, each partial decoder 404, 406, 408, 410 is directly coupled with every other partial decoder.

Further regarding the embodiments described in relation to FIGS. 3 and 4, the number of inputs and partial decoders used in a particular implementation can be varied. For example, some applications may have three or more inputs and some applications may have three, five, six or more partial decoders. In addition, two-way communication is not required. In FIG. 3, for example, communication links such as 320, 312 and 316 can be omitted if a communication link (not shown) from partial decoder 304 to partial decoder 310 is added. Similarly with regard to FIG. 4, for example, communication links such as 412, 414, 416, 424, 426 and 428 can be omitted.

Figure 5:
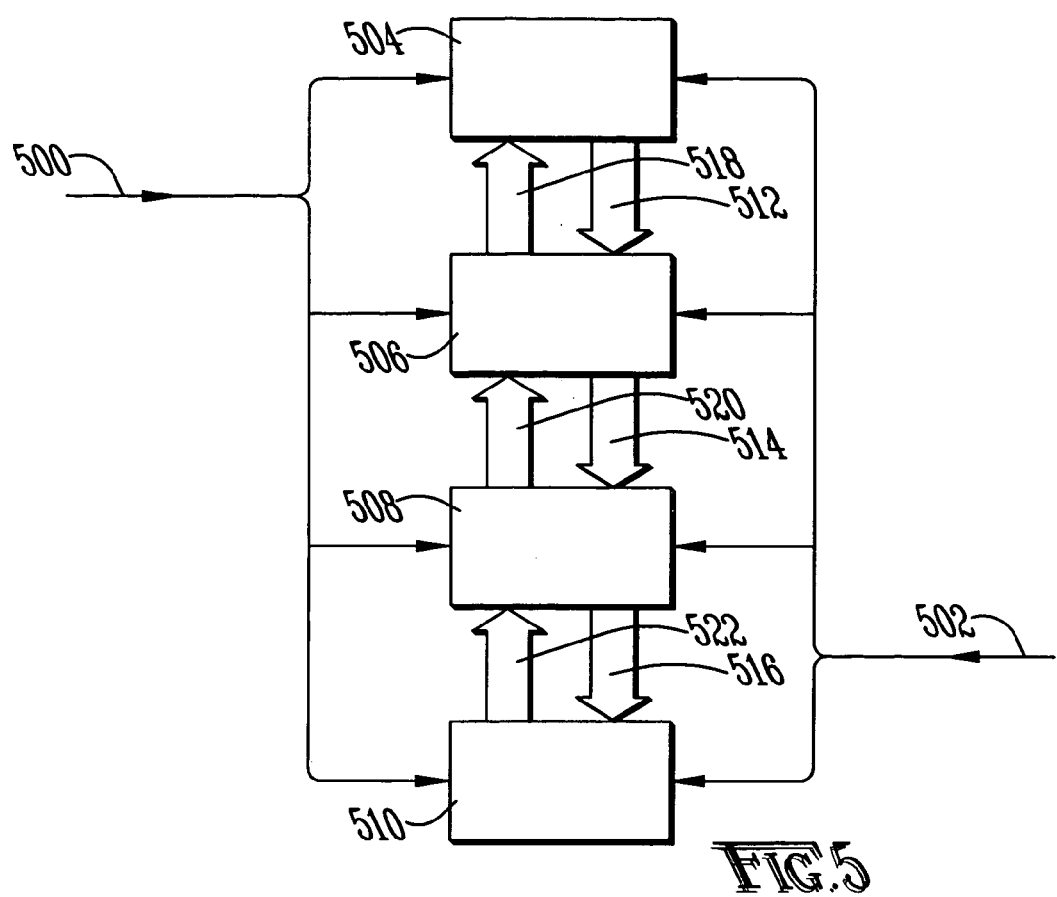
FIG. 5 depicts an embodiment of a multiple input diversity decoding apparatus including two inputs and four partial decoders, each partial decoder being coupled with both inputs.

FIG. 5 depicts yet another embodiment of a multiple input diversity decoding system. Although the implementation depicted in FIG. 5 contains two inputs 500, 502 and four partial decoders 504, 506, 508, 510, other implementations can include different numbers of inputs and partial decoders. In addition, if a communication link (not shown) is established from partial decoder 504 to partial decoder 510, then communication links 512, 514 and 516 can be omitted.

In the embodiments related to FIG. 5, each partial decoder (504, 506, 508, 510 in the implementation depicted in FIG. 5) is directly coupled with each of the inputs (500, 502 in the implementation depicted in FIG. 5). Upon receiving an information segment from each input 500, 502, decoding can proceed in a variety of ways. In one embodiment, each partial decoder 504, 506, 508, 510 combines in some way the two versions of the information it receives from its coupled inputs 500, 502. The inputs can be combined by averaging them together, by assigning a weight to each input and then averaging them, or by combining them in some other way. The partial decoders can then use the combined input information to iteratively decode the content.

In another embodiment, the partial decoders 504, 506, 508, 510 treat each version of the inputted information separately. For example, first the information received from one input 500 can be iteratively decoded for several iterations and then the information received from the other input 502 can be iteratively decoded for several iterations. The process can be repeated if necessary until sufficient agreement is reached or a certain number of iterations have been performed.

Alternatively, the partial decoders can switch back and forth between the information received from the various inputs until sufficient agreement is reached or a certain number of iterations have been performed. For example, information received by input 500 can be decoded for one iteration and then information received by input 502 can be decoded for one iteration. The partial decoders 504, 506, 508, 510 can continue to alternate between the information from each input, iteration-by-iteration, until the decoding of that particular information segment reaches the termination point (sufficient agreement or iteration limit).

It is thought that the method and apparatus of the present invention will be understood from the description provided throughout this specification and the appended claims, and that it will be apparent that various changes may be made in the form, construct steps and arrangement of the parts and steps thereof, without departing from the spirit and scope of the invention or sacrificing all of their material advantages. The forms herein described are merely exemplary embodiments thereof.

What is claimed is:

1. A multiple input diversity decoding apparatus, comprising:
   a first input line;
   a second input line;
   a first diversity decoder, comprising;
     a first partial decoder, coupled with said first input line;
     a second partial decoder, coupled with said first input line, said second partial decoder being communicatively coupled with said first partial decoder; and
     said first partial decoder and said second partial decoder being configured to perform an iterative decoding of information input to said first diversity decoder via said first input line; and
   a second diversity decoder, communicatively coupled with said first diversity decoder, comprising;
     a third partial decoder, coupled with said second input line;
     a fourth partial decoder, coupled with said second input line, said fourth partial decoder being communicatively coupled with said third partial decoder; and
     said third partial decoder and said fourth partial decoder being configured to perform an iterative decoding of information input to said second diversity decoder via said second input line; and
   wherein said first diversity decoder and said second diversity decoder are configured to perform an iterative decoding of information input into the multiple input diversity decoder apparatus via said first input line and said second input line.

2. The multiple input diversity decoding apparatus of claim 1, further comprising:
   a third input line:
   a third diversity decoder, communicatively coupled with said second diversity decoder, comprising;
     a fifth partial decoder, coupled with said third input line; and
     a sixth partial decoder, coupled with said third input line, said sixth partial decoder being communicatively coupled with said fifth partial decoder;
   wherein said fifth partial decoder and said sixth partial decoder are configured to perform an iterative decoding of information input to said third diversity decoder via said third input line; and
   wherein said first diversity decoder, said second diversity decoder and said third diversity decoder are configured to perform an iterative decoding of information input into the multiple input diversity decoder apparatus via said first input line, said second input line and said third input line.

3. The multiple input diversity decoding apparatus of claim 2, further comprising:
   a seventh partial decoder, located in said first diversity decoder, wherein said seventh partial decoder is communicatively coupled with said second partial decoder; and wherein said first partial decoder, said second partial decoder and said seventh partial decoder are configured to perform an iterative decoding of information input to said first diversity decoder via said first input line.

4. The multiple input diversity decoding apparatus of claim 3, further comprising:

an eighth partial decoder, located in said second diversity decoder, wherein said eighth partial decoder is communicatively coupled with said fourth partial decoder; and wherein said third partial decoder, said fourth partial decoder and said eighth partial decoder are configured to perform an iterative decoding of information input to said second diversity decode via said second input line.

5. The multiple input diversity decoding apparatus of claim 4, further comprising:

a ninth partial decoder, located in said third diversity decoder, wherein said ninth partial decoder is communicatively coupled with said sixth partial decoder; and wherein said fifth partial decoder, said sixth partial decoder and said ninth partial decoder are configured to perform an iterative decoding of information input to said third diversity decoder via said third input line.

6. The multiple input diversity decoding apparatus of claim 2, wherein said third diversity decoder is also communicatively coupled with said first diversity decoder.

7. The multiple input diversity decoding apparatus of claim 1, wherein said first diversity decoder further comprises:

a fifth partial decoder, coupled with said first input line, wherein said fifth partial decoder is communicatively coupled with said first partial decoder; and said first partial decoder, said second partial decoder and said fifth partial decoder being configured to perform an iterative decoding of information input to said first diversity decoder via said first input line.

8. The multiple input diversity decoding apparatus of claim 7, wherein said second diversity decoder further comprises:

a sixth partial decoder, coupled with said second input line, said sixth partial decoder being communicatively coupled with said third partial decoder; and said third partial decoder, said fourth partial decoder and said sixth partial decoder being configured to perform an iterative decoding of information input to said second diversity decoder via said second input line.

9. The multiple input diversity decoding apparatus of claim 8, wherein said sixth partial decoder is also communicatively coupled with said fourth partial decoder.

10. The multiple input diversity decoding apparatus of claim 7, wherein said fifth partial decoder is also communicatively coupled with said second partial decoder.

11. A method for diversity decoding of multiple inputs, comprising the steps of:

receiving an information segment via a first input line;

receiving an information segment via a second input line, said step of receiving an information segment via a second input line being accomplished essentially simultaneously with said step of receiving an information segment via a first input line;

performing an iterative decoding of the information segment received via the first input line;

performing an iterative decoding of the information segment received via the second input line, said step of performing an iterative decoding of the information segment received via the second input line being accomplished essentially simultaneously with said step of performing an iteravitve decoding of the information segment received via the first input line; and performing an iterative decoding of information segments determined via said step of performing an iterative decoding of the information segment received via the first input line and said step of performing an iterative decoding of the information segment received via the second input line.

12. The method of claim 11, further comprising the step of receiving an information segment via a third input line, said step of receiving an information segment via a third input line being accomplished essentially simultaneously with said step of receiving an information segment via a first input line.

13. The method of claim 12, further comprising the step of performing an iterative decoding of the information segment received via the third input line, said step of performing an iterative decoding of the information segment received via the third input line being accomplished essentially simultaneously with said step of performing an iterative decoding of the information segment received via the first input line.

14. The method of claim 13, wherein the step of performing an iterative decoding of information segments determined via said steps of performing an iterative decoding of the information segment received via the first input line and the second input line, further comprises performing an iterative decoding of information segments determined via said step or performing an iterative decoding of the information segment received via the third input line.

* * * * *